United States Patent [19]
Bullock et al.

[11] Patent Number: 5,363,049
[45] Date of Patent: Nov. 8, 1994

[54] SINGLE DEVICE UNDER TEST (DUT) PORT COMMON REFERENCE/MATCHING IMPEDANCE CIRTUIT FOR THE DETECTION AND LOCATION OF DUT FAULTS

[75] Inventors: Andrew G. Bullock, Hemel Hemstead; George Hjipieris, Hitchin, both of England

[73] Assignee: Marconi Instruments Limited, United Kingdom

[21] Appl. No.: 8,167

[22] Filed: Jan. 25, 1993

[30] Foreign Application Priority Data

Jan. 27, 1992 [GB] United Kingdom ............... 9201835

[51] Int. Cl.$^5$ ............................................. G01R 31/08
[52] U.S. Cl. ................................ 324/520; 324/525; 324/637
[58] Field of Search .............. 324/520, 525, 534, 608, 324/637, 638, 645–647; 333/109, 125

[56] References Cited

U.S. PATENT DOCUMENTS

| | | | |
|---|---|---|---|
| 3,693,078 | 9/1972 | Sorgek | 324/645 |
| 4,427,936 | 1/1984 | Riblet et al. | 324/638 |
| 4,641,082 | 2/1987 | Griffin et al. | 324/638 |
| 4,769,592 | 9/1988 | Potter et al. | 324/638 |
| 4,808,913 | 2/1989 | Grace | 324/638 |
| 4,845,446 | 7/1989 | Roth | 333/81 R |

*Primary Examiner*—Kenneth A. Wieder
*Assistant Examiner*—Christopher M. Tobin
*Attorney, Agent, or Firm*—Kirschstein, Ottinger, Israel & Schiffmiller

[57] ABSTRACT

Disclosed is a Device Under Test (DUT) fault detection and location circuit. A first circuit port is connected to the DUT for fault detection and location. A signal source for generating a series of signals across the operating frequency range of the DUT is connected to a second circuit port. A divider divides each signal generated by the source so as to provide first and second fractions of the signal, the second fraction passing to the device under test. A fault detection section provides a DUT fault detection voltage for each respective frequency. The circuit also has a branch including an impedance section and a fault location section. The branch receives the first fraction, and the fault location section provides a DUT fault location voltage for each respective frequency. The fault detection section is connected between the impedance section and the DUT such that each fault detection voltage it provides indicates whether a predetermined relationship exists between the impedance of the impedance section and the impedance presented by the DUT. In addition to serving as a reference impedance for fault detection, the impedance section serves to match the fault location section which performs fault location measurements to the impedance presented to the fault location section by the divider.

8 Claims, 2 Drawing Sheets

SINGLE DEVICE UNDER TEST (DUT) PORT COMMON REFERENCE/MATCHING IMPEDANCE CIRTUIT FOR THE DETECTION AND LOCATION OF DUT FAULTS

BACKGROUND OF THE INVENTION

This invention relates to circuits for use in the detection and location of a fault or faults in a device under test (DUT).

One known such circuit is shown schematically in FIG. 1 of the accompanying drawings, and is typically used in the detection and location of a fault or faults in a transmission line, or a component constructed using transmission line, required to operate satisfactorily over a range of microwave frequencies.

Referring to FIG. 1, the known circuit comprises first, second and third ports 1, 3, 5, a power dividing network 7, and first and second sub-circuits 9, 11. Sub-circuit 9 comprises a power divider 17, a fault detection section 14, and a reference impedance 13. Divider 17 comprises a delta-shaped impedance network comprising three impedances 19, 21, 23 of equal value equal to the characteristic impedance to which fault detection measurements are referenced, i.e. the impedance of reference impedance 13, see below. Fault detection section 14 comprises a diode 15 and capacitors 16, 18. Sub-circuit 11 comprises a power divider 31, an impedance network 25, and a fault location section 24. Divider 31 comprises a star-shaped impedance network comprising three impedances 33, 35, 37 of equal value equal to one third of the characteristic impedance to which fault detection measurements are referenced, i.e. the impedance of reference impedance 13, see below. Fault location section 24 comprises a diode 29 and capacitor 27. The aforespecified circuit components are connected as shown in FIG. 1.

In use of the circuit in the detection of a fault or faults in a DUT 39, the DUT 39 is connected to port 1, and to port 5 is connected a signal source 41 which generates a plurality of signals of different frequencies which extend over the aforementioned range of microwave frequencies.

The source 41 generates a signal of a first frequency of the plurality of frequencies, which signal is divided by network 7 between sub-circuits 9 and 11. The signal from network 7 which passes to sub-circuit 9 is divided by divider 17 such that a first fraction thereof passes to DUT 39, and a second fraction thereof passes to reference impedance 13.

If DUT 39 is not faulty a predetermined relationship, dependent on the frequency generated by source 41, will exist between the impedance of reference impedance 13 and the impedance presented by DUT 39. Whether or not this predetermined relationship exists will be indicated by the voltage across diode 15 of fault detection section 14, as measured at 43. The voltage at 43 is a measure of the return loss or VSWR (voltage standing wave ratio) of DUT 39 at the frequency of source 41.

The voltage at 43 is measured for each of the remaining frequencies,of the plurality of frequencies of source 41. The return loss/VSWR characteristic comprising the voltage measurements made at 43 plotted against frequency is studied to determine whether the DUT 39 is operating satisfactorily, if not a faulty DUT 39 is indicated.

In use of the circuit in the location of a fault or faults, detected as described above, in DUT 39, DUT 39 is removed from port 1 and connected to port 3. The source 41 generates a signal of a first frequency of the plurality of frequencies, which signal is divided by network 7 between sub-circuits 9 and 11. The signal from network 7 which passes to sub-circuit 11 is divided equally by divider 31 between DUT 39 and the branch of sub-circuit 11 comprising network 25 and fault location section 24.

A fault or faults in DUT 39 will partially reflect the signal incident on DUT 39. This reflection will add to the signal received from divider 31 by the branch of sub-circuit 11 comprising network 25 and fault location section 24. Consequently, the voltage across capacitor 27 of fault location section 24 will be altered from what it would otherwise have been at the frequency of source 41. The voltage across capacitor 27 is measured at 45.

The voltage at 45 is measured for each of the remaining frequencies of the plurality of frequencies of source 41. A plot of the voltages measured at 45 versus frequency comprises a ripple pattern which contains information as to the location of the fault or faults in DUT 39. This ripple pattern is processed by a scalar analyser (not shown) which extracts this information and determines the location(s) of the fault(s).

In sub-circuit 11 network 25 matches fault location section 24 to the impedance presented thereto by divider 31 and attenuates the signals received by the branch containing network 25 and section 24 such that diode 29 operates within the linear region of its operating characteristic.

SUMMARY OF THE INVENTION

It is an object of the present invention to simplify the circuit of FIG. 1. It is also an object of the present invention to provide a circuit for use in the detection and location of a fault or faults in a DUT which requires the connection of the DUT to one port only of the circuit for both fault detection and fault location that is which does not require the initial connection of the DUT to one port of the circuit for fault detection and the subsequent connection of the DUT to another port for fault location, as occurs in the circuit of FIG. 1.

According to the present invention there is provided a circuit for use in the detection and location of a fault or faults in a device under test comprising: a first port to which is connected the device under test for fault detection and location; a second port to which is connected a signal source which generates a plurality of signals of different frequencies which extend over the frequency range over which it is required that the device under test operate satisfactorily; a divider for dividing each signal generated by the source thereby to provide first and second fractions thereof, the second fraction passing to the device under test; a fault detection section for providing in respect of each of said frequencies a fault detection voltage for use in the detection of the fault or faults; and a branch including a fault location section, said branch receiving said first fraction, said fault location section providing in respect of each of said frequencies a fault location voltage for use in the location of the or each fault.

BRIEF DESCRIPTION OF THE DRAWINGS

Two circuits for use in the detection and location of a fault or faults in a DUT in accordance with the present invention will now be described, by way of example, with reference to the accompanying drawings, in which.

DETAILED DESCRIPTION OF THE PREFERRED EMBODIMENTS

Figure 2:
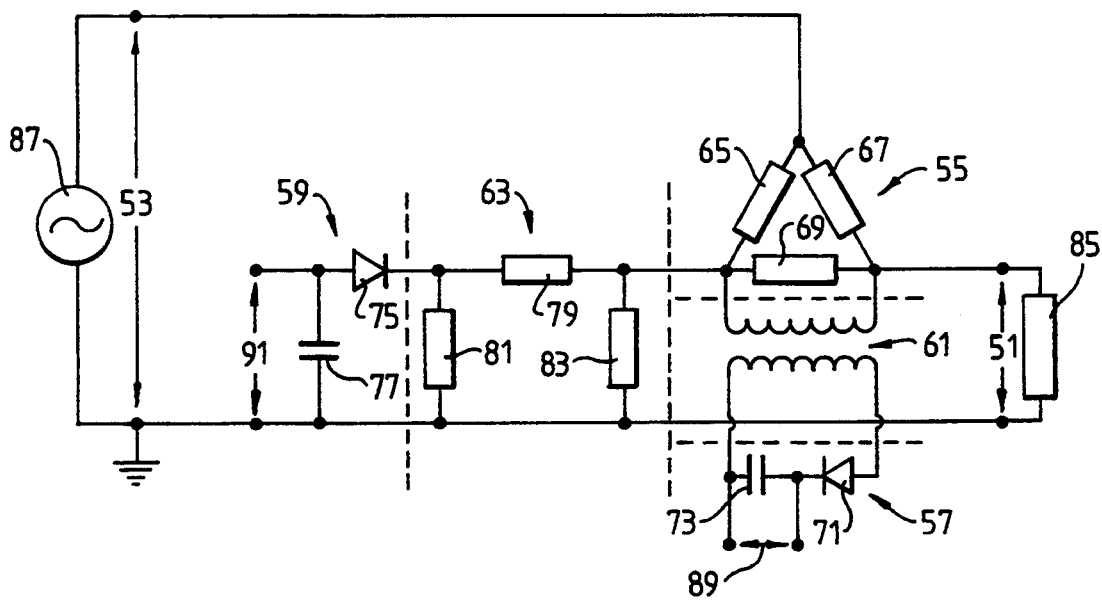
FIG. 2 is a schematic circuit in accordance with the present invention diagram of the first circuit.
Figure 3:
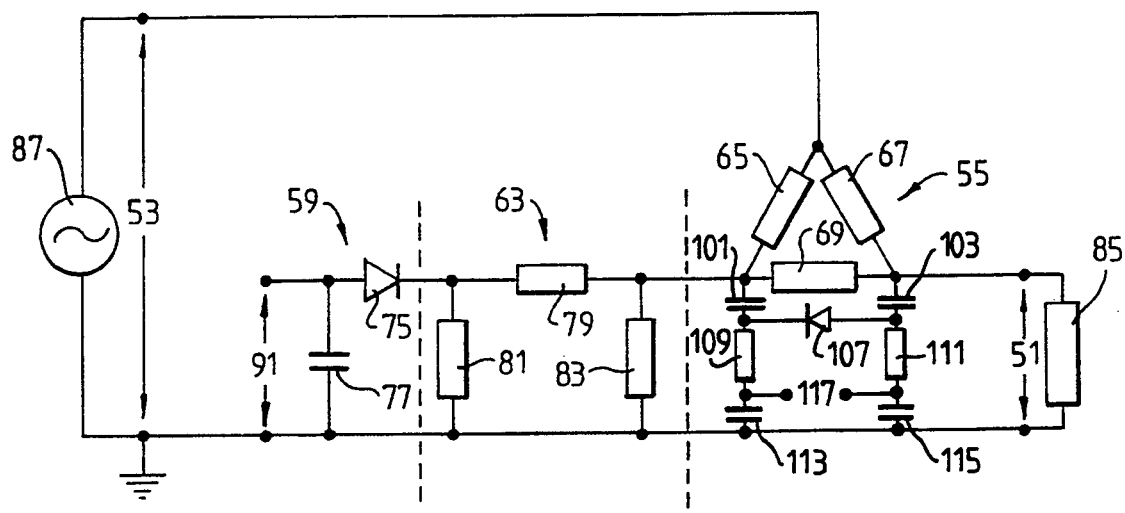
FIG. 3 is a schematic circuit in accordance with the present invention diagram of the second circuit.

The circuits of FIGS. 2 and 3 are each typically used in the detection and location of a fault or faults in a transmission line, or a component constructed using transmission line, required to operate satisfactorily over a range of microwave frequencies.

Referring to FIG. 2, the first circuit comprises first and second ports 51, 53, a power divider 55, a fault detection section 57, a fault location section 59, a balun 61, and an impedance network 63. The divider 55 comprises a delta-shaped impedance network comprising three impedances 65, 67, 69 of equal value equal to the characteristic impedance to which fault detection measurements are referenced, i.e. the impedance presented by the branch of the first circuit comprising fault location section 59 and impedance network 63, see below. The fault detection section 57 comprises a diode 71 and capacitor 73. The fault location section 59 comprises a diode 75 and capacitor 77. The impedance network 63 comprises three impedances 79, 81, 83. The aforespecified circuit components are connected as shown in FIG. 2.

In use of the first circuit in the detection and location of a fault or faults in a DUT 85, the DUT 85 is connected to port 51, and to port 53 is connected a signal source 87 which generates a plurality of signals of different frequencies which extend over the aforementioned range of microwave frequencies.

The source 87 generates a signal of a first frequency of the plurality of frequencies, which signal is divided by divider 55 such that a first fraction thereof passes to DUT 85, and a second fraction thereof passes to the circuit branch comprising network 63 and fault location section 59.

Figure 1:
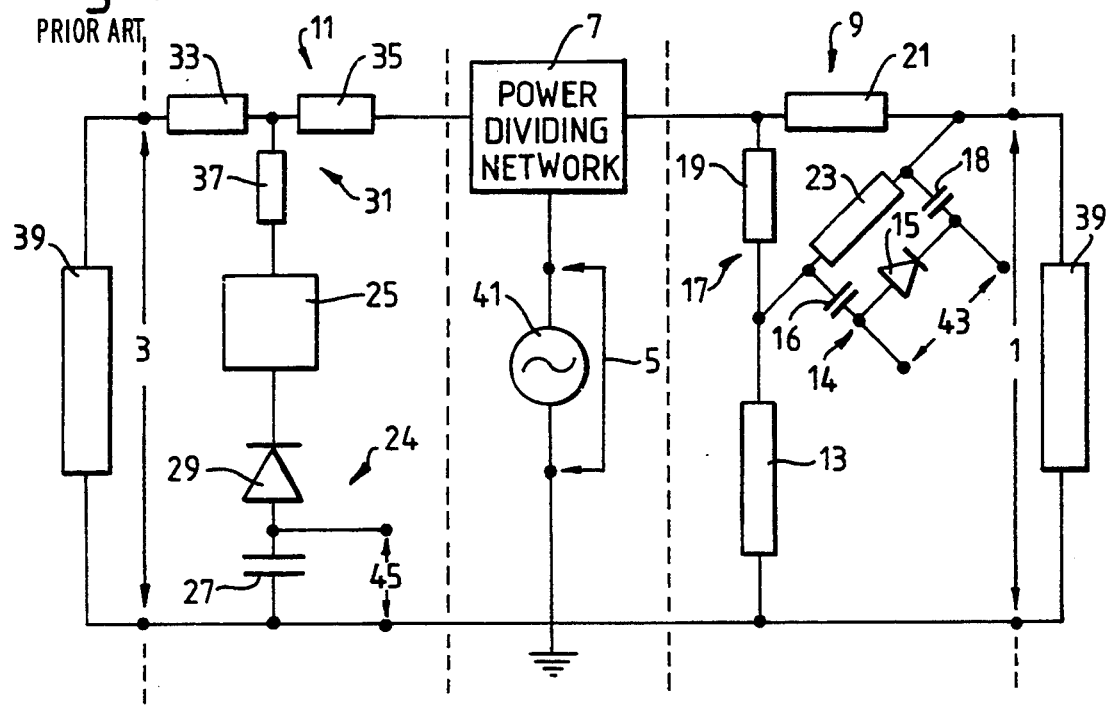
FIG. 1 is a schematic circuit diagram of the previously described prior art circuit for use in the detection and location of a fault or faults in a DUT.

The impedance network 63 serves as the reference impedance 13 of the prior art circuit of FIG. 1, that is, if DUT 85 is not faulty a predetermined relationship, dependent on the frequency generated by source 87, will exist between the impedance of network 63 and the impedance presented by DUT 85. Whether or not this predetermined relationship exists will be indicated by the voltage across capacitor 73 of fault detection section 57, as measured at 89. The voltage at 89 is a measure of the return loss or VSWR of DUT 85 at the frequency of source 87. The balun 61 decouples the ground of fault detection section 57 from the ground of divider 55.

A fault or faults in DUT 85 will partially reflect the first fraction incident on DUT 85. This reflection will add to the second fraction received by the circuit branch comprising network 63 and fault location section 59. Consequently, the voltage across capacitor 77 of fault location section 59 will be altered from what it would otherwise have been at the frequency of source 87. The voltage across capacitor 77 is measured at 91.

The voltages at 89 and 91 are measured for the remaining frequencies of the plurality of frequencies of source 87. The return loss/VSWR characteristic comprising the voltage measurements made at 89 plotted against frequency is studied to determine whether the DUT 85 is operating satisfactorily, if not a faulty DUT 85 is indicated. A plot of the voltages measured at 91 versus frequency comprises a ripple pattern which contains information as to the location of the fault or faults in DUT 85. This ripple pattern is processed by a scalar analyser (not shown) which extracts this information and determines the location(s) of the fault(s).

The impedance network 63 serves as network 25 of the prior art circuit of FIG. 1, it matches fault location section 59 to the impedance presented thereto by divider 55, and attenuates the second fractions received by the circuit branch comprising network 63 and section 59 such that diode 75 operates within the linear region of its operating characteristic. Thus, network 63 has dual function, it serves as a reference impedance in fault detection and as a matching and attenuating network in fault location.

Referring also to FIG. 3, components of the second circuit that are the same as those of the first circuit of FIG. 2 are labelled with the same reference numerals. The second circuit is the same as the first except that balun 61 is replaced by capacitors 101, 103 and impedances 109, 111, and fault detection section 57 is replaced by a fault detection section comprising diode 107 and capacitors 113, 115. The voltages for the return loss/VSWR characteristic are measured at 117, each voltage comprising the difference between the voltages dropped across capacitors 113, 115 at the frequency of measurement.

Figure 4:
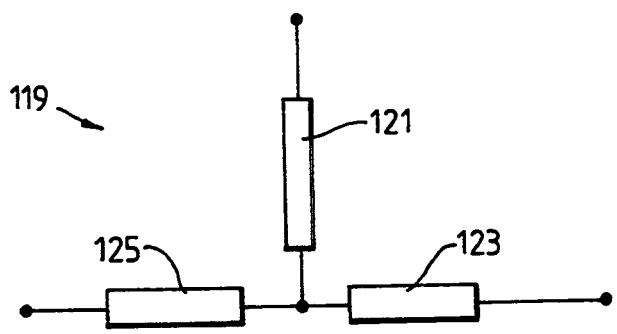
FIG. 4 illustrates a modification to the circuits of FIGS. 2 and 3.

Referring also to FIG. 4, each of the delta-shaped impedance networks 55 of FIGS. 2 and 3 could be replaced by the star-shaped impedance network 119 of FIG. 4, where $Z'=Z/3$, where Z is the impedance of each of the impedances 65, 67, 69 of network 55 and Z' is the impedance of each of the impedances 121, 123, 125 of network 119.

We claim:

1. A circuit for use in the detection of the presence and location of the position of a fault or faults in a device under test comprising: a first port to which is connected the device under test for fault detection and location; a second port to which is connected a signal source which generates a plurality of signals of different frequencies which extend over the frequency range over which it is required that the device under test operate satisfactorily; a divider for dividing each signal generated by the source thereby to provide first and second fractions thereof, the second fraction passing to the device under test; a fault detection section for providing in respect of each of said frequencies a fault detection voltage for use in the detection of the presence in the device under test of the fault or faults; and a branch including an impedance section and a fault location section, said branch receiving said first fraction, said fault location section providing in respect of each of said frequencies a fault location voltage for use in the location of the position or positions in the device under test of the fault or faults, said fault detection section being connected in said circuit between said impedance section and the device under test such that each fault detection voltage provided thereby indicates whether a predetermined relationship exists between the impedance of said impedance section and the impedance presented by the device under test, said impedance section in addition to serving as a reference impedance for fault detection measurements also serving to match the fault location section which performs fault location measurements to the impedance presented thereto by said divider.

2. A circuit according to claim 1 wherein said divider comprises a delta-shaped impedance network comprising first, second and third impedances of equal value equal to the characteristic impedance to which fault detection measurements are referenced, one side of each of the first and second impedances and one side of She source being connected to a first junction of said network, the other side of the first impedance and one side of the third impedance and one side of said branch being connected to a second junction of said network, the other side of each of the second and third impedances and one side of the device under test being connected to a third junction of said network, said fault detection section being connected across the third impedance.

3. A circuit according to claim 1 wherein said divider comprises a star-shaped impedance network comprising first, second and third impedances of equal value equal to one third of the characteristic impedance to which fault detection measurements are referenced, one side of each of the first, second and third impedances being connected to a central junction of said network, the other side of the first impedance being connected to one side of the source, the other side of the second impedance being connected to one side of said branch, the other side of the third impedance being connected to one side of the device under test, said fault detection section being connected across the second and third impedances.

4. A circuit according to claim 1 wherein said fault location section comprises a diode in series with a capacitor, each fault location voltage being taken across the capacitor, and said impedance section attenuates said first fractions of the signals generated by said source such that said diode operates within the linear region of its operating characteristic.

5. A circuit according to claim 1 wherein said fault detection section comprises a diode in series with a capacitor, each fault detection voltage being taken across the capacitor, said fault detection section being connected in said circuit by way of a balun.

6. A circuit according to claim 1 wherein: said fault detection section comprises a diode, and first and second capacitors; and said circuit includes first and second impedances and third and fourth capacitors, one side of each of the first and second capacitors being grounded, the other side of the first capacitor being connected to one side of the first impedance, the other side of the second capacitor being connected to one side of the second impedance, the other side of the first impedance being connected to one side of the diode and one side of the third capacitor, the other side of the second impedance being connected to the other side of the diode and one side of the fourth capacitor, each fault detection voltage being taken between the other sides of said first and second capacitors, the other sides of the third and fourth capacitors being connected in said circuit.

7. A circuit according to claim 1 wherein said impedance section comprises a network of three impedances.

8. A circuit according to claim I for use in the detection and location of a fault or faults in a device under test which is at least one of a transmission line, and a component constructed using transmission line, required to operate satisfactorily over a range of microwave frequencies.

* * * * *